United States Patent
Cooperberg et al.

(10) Patent No.: US 6,577,915 B1
(45) Date of Patent: Jun. 10, 2003

(54) APPLICATIONS OF A SEMI-EMPIRICAL, PHYSICALLY BASED, PROFILE SIMULATOR

(75) Inventors: David Cooperberg, Mt. Kisco, NY (US); Vahid Vahedi, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 322 days.

(21) Appl. No.: 09/608,163

(22) Filed: Jun. 30, 2000

Related U.S. Application Data

(63) Continuation-in-part of application No. 09/033,997, filed on Mar. 3, 1998, now Pat. No. 6,151,532.

(51) Int. Cl.[7] .......................... G05B 13/02; H01L 21/00
(52) U.S. Cl. .......................... 700/121; 438/9; 700/30; 703/13
(58) Field of Search .......................... 700/29–31, 97, 700/103, 104, 121; 438/8, 9, 14, 16, 788, 792, 798; 703/6, 13

(56) References Cited

U.S. PATENT DOCUMENTS

| | | | | | |
|---|---|---|---|---|---|
| 5,642,296 A | * | 6/1997 | Saxena | .......................... | 702/84 |
| 5,861,752 A | * | 1/1999 | Klick | .......................... | 324/464 |
| 5,869,402 A | * | 2/1999 | Harafuji et al. | .............. | 438/729 |
| 5,871,805 A | * | 2/1999 | Lemelson | ...................... | 427/8 |
| 5,900,633 A | * | 5/1999 | Solomon et al. | ....... | 250/339.08 |
| 6,041,734 A | * | 3/2000 | Raoux et al. | ............ | 118/723 E |
| 6,110,214 A | * | 8/2000 | Klimasauskas | ................ | 703/2 |
| 6,136,388 A | * | 10/2000 | Raoux et al. | ................ | 427/569 |
| 6,162,709 A | * | 12/2000 | Raoux et al. | ................ | 438/513 |
| 6,301,510 B1 | * | 10/2001 | Cooperberg et al. | ............ | 700/28 |

* cited by examiner

Primary Examiner—Leo Picard
Assistant Examiner—Paul Rodriguez
(74) Attorney, Agent, or Firm—Thelen Reid & Priest LLP; Thierry K. Lo

(57) ABSTRACT

A method and an apparatus for a semi-empirical process simulation using a calibrated profile simulator to create a reactor model which can predict neutral and ion flux distributions on a substrate as a function of the reactor settings include providing a set of conditions characterized by unique reactor settings. Wafers are processed under each condition. Etch or deposition rates and surface profiles are measured and used in the calibrated profile simulator to derive the flux distributions. The flux distributions data generated by the processes are then used to create a reactor model.

18 Claims, 4 Drawing Sheets

APPLICATIONS OF A SEMI-EMPIRICAL, PHYSICALLY BASED, PROFILE SIMULATOR

CROSS-REFERENCE TO RELATED APPLICATIONS

This is a continuation-in-part of U.S. patent application Ser. No. 09/033,997, filed Mar. 3, 1998 in the names of inventors Maria E. Barone, Richard A. Gottscho, and Vahid Vahedi and commonly assigned herewith. It is also related to Method and Apparatus to calibrate a semi-empirical process simulator, Enhance process and profile simulator algorithms filed on common date herewith.

BACKGROUND OF THE INVENTION

1. Field of the Invention

This invention relates to plasma processing of semiconductor devices. In particular, this invention provides a method and an apparatus to predict ion and neutral flux distributions on a substrate as a function of reactor settings using a calibrated profile simulator.

2. Background Art

Various forms of processing with ionized gases, such as plasma etching and reactive ion etching, are increasing in importance particularly in the area of semiconductor device manufacturing. Of particular interest are the devices used in the etching process. FIG. 1 illustrates a conventional inductively coupled plasma etching system 100 that may be used in the processing and fabrication of semiconductor devices. Inductively coupled plasma processing system 100 includes a plasma reactor 102 having a plasma chamber 104 therein. A transformer coupled power (TCP) controller 106 and a bias power controller 108 respectively control a TCP power supply 110 and a bias power supply 112 influencing the plasma created within plasma chamber 104.

TCP power controller 106 sets a set point for TCP power supply 110 configured to supply a radio frequency (RF) signal, tuned by a TCP match network 114, to a TCP coil 116 located near plasma chamber 104. A RF transparent window 118 is typically provided to separate TCP coil 116 from plasma chamber 104 while allowing energy to pass from TCP coil 116 to plasma chamber 104.

Bias power controller 108 sets a set point for bias power supply 112 configured to supply a RF signal, tuned by a bias match network 120, to an electrode 122 located within the plasma reactor 104 creating a direct current (DC) bias above electrode 122 which is adapted to receive a substrate 124, such as a semi-conductor wafer, being processed.

A gas supply mechanism 126, such as a pendulum control valve, typically supplies the proper chemistry required for the manufacturing process to the interior of plasma reactor 104. A gas exhaust mechanism 128 removes particles from within plasma chamber 104 and maintains a particular pressure within plasma chamber 104. A pressure controller 130 controls both gas supply mechanism 126 and gas exhaust mechanism 128.

A temperature controller 134 controls the temperature of plasma chamber 104 to a selected temperature setpoint using heaters 136, such as heating cartridges, around plasma chamber 104.

In plasma chamber 104, substrate etching is achieved by exposing substrate 124 to ionized gas compounds (plasma) under vacuum. The etching process starts when the gases are conveyed into plasma chamber 104. The RF power delivered by TCP coil 116 and tuned by TCP match network 110 ionizes the gases. The RF power, delivered by electrode 122 and tuned by bias match network 120, induces a DC bias on substrate 124 to control the direction and energy of ion bombardment of substrate 124. During the etching process, the plasma reacts chemically with the surface of substrate 124 to remove material not covered by a photoresistive mask.

Input parameters such as plasma reactor settings are of fundamental importance in plasma processing. The amount of actual TCP power, bias power, gas pressure, gas temperature, and gas flow within plasma chamber 104 greatly affects the process conditions. Significant variance in actual power delivered to plasma chamber 104 may unexpectedly change the anticipated value of other process variable parameters such as neutral and ionized particle density, temperature, and etch rate.

Traditionally, a suite of values of these input parameters suitable for creating a given set of device features has been determined by trial and error. Development of a single process by this empirical approach is costly and time-consuming, requiring treatment of several patterned wafers and subsequent study of the resulting profiles by scanning electron microscopy. Because of the unpredictable way a small change in one input parameter may affect the profile, any modification of the layout—for example, in device dimension, pattern density on the wafer or change in total open area—from one application to another, has often necessitated redevelopment of the process, with the attendant outlay of resources.

Recent advances in device fabrication technology are rendering this approach even more onerous. Decreasing feature sizes demand tighter tolerances on feature dimensions and morphologies, so that the number of trials required to optimize a given process is increasing. The acceleration of wafer diameter growth and the complete redesign of the process involved with an incremental change in diameter have increased the number of times this empirical process must be repeated. The-increasing use of devices tailor-made to a specific application also increases the amount of development and optimization activity required.

An alternative, computational approach would derive input parameters from a complete physical description of a plasma process including a plasma model for describing the coupling between the macroscopic input parameters and the macroscopic fluxes, concentrations and energy distributions of the various species in the plasma; and a profile simulator for determining atomistically from the macroscopic fluxes the resulting etch or deposition rate along the wafer surface and calculating the profile evolution therefrom. Ideally, such a physical description of plasma etching and deposition processes would enable the ab initio selection of the macroscopic input parameters appropriate for generating a desired profile on the substrate, eliminating the need for expensive and time-consuming test sequences.

Research in this field has done much to elucidate mechanisms at work in plasma processes, and thus has contributed scaling laws that could frame a physical description. However, notwithstanding the availability of computational means sufficiently powerful to perform the necessary calculations based on known scaling laws, the implementation of such an ab initio approach has been limited by lack of data. For example, the manner in which the values of some coefficients in these laws depend on the particulars of a given process is unknown as yet. In some investigations, determination of the value of such a scaling coefficient consistent with a plasma process defined by a given set of input parameters has been done by comparing a finished profile, created by applying that process, with a simulated profile including one or more of these coefficients as adjustable parameters. Such hindsight evaluation may promote understanding a given coefficient's role in scaling law, but it has not afforded the ability to predict profile evolution for any process defined by a set of input parameters differing from the set used in the experimental process used to derive the value of that coefficient.

Thus, there is a need for a method to accurately predict process settings to obtain a desired surface profile evolution on any reactor design model or any substrate layout.

SUMMARY OF THE INVENTION

A method and an apparatus for a semi-empirical process simulation using a calibrated profile simulator to create a reactor model which can predict neutral and ion flux distributions on a substrate as a function of the reactor settings include providing a set of conditions characterized by unique reactor settings. Wafers are processed under each condition. Etch or deposition rates and surface profiles are measured and used in the calibrated profile simulator to derive the flux distributions. The flux distributions data generated by the processes are then used to create a reactor model.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

Figure 1:
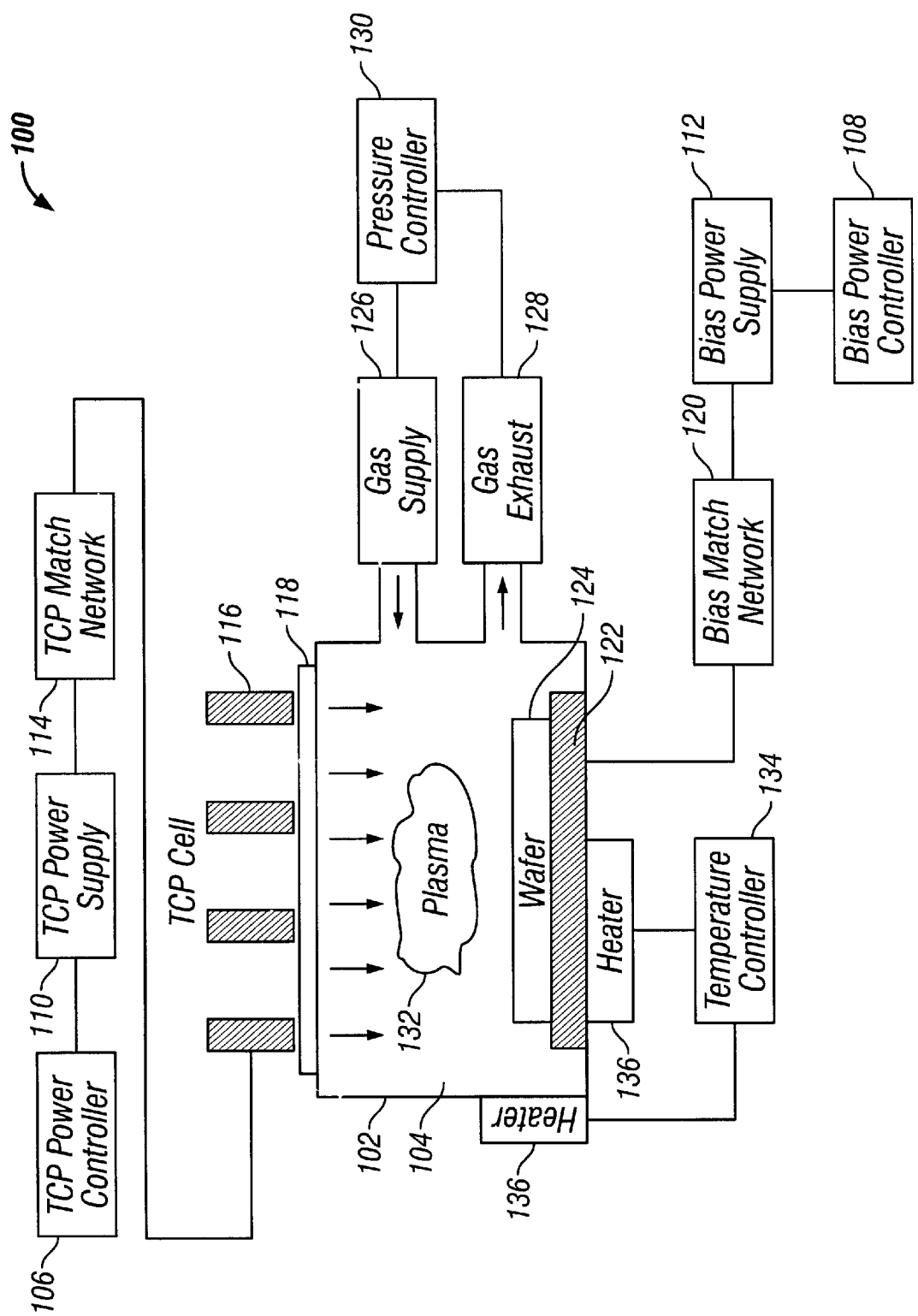
FIG. 1 is a block diagram showing a plasma etching system
Figure 2:
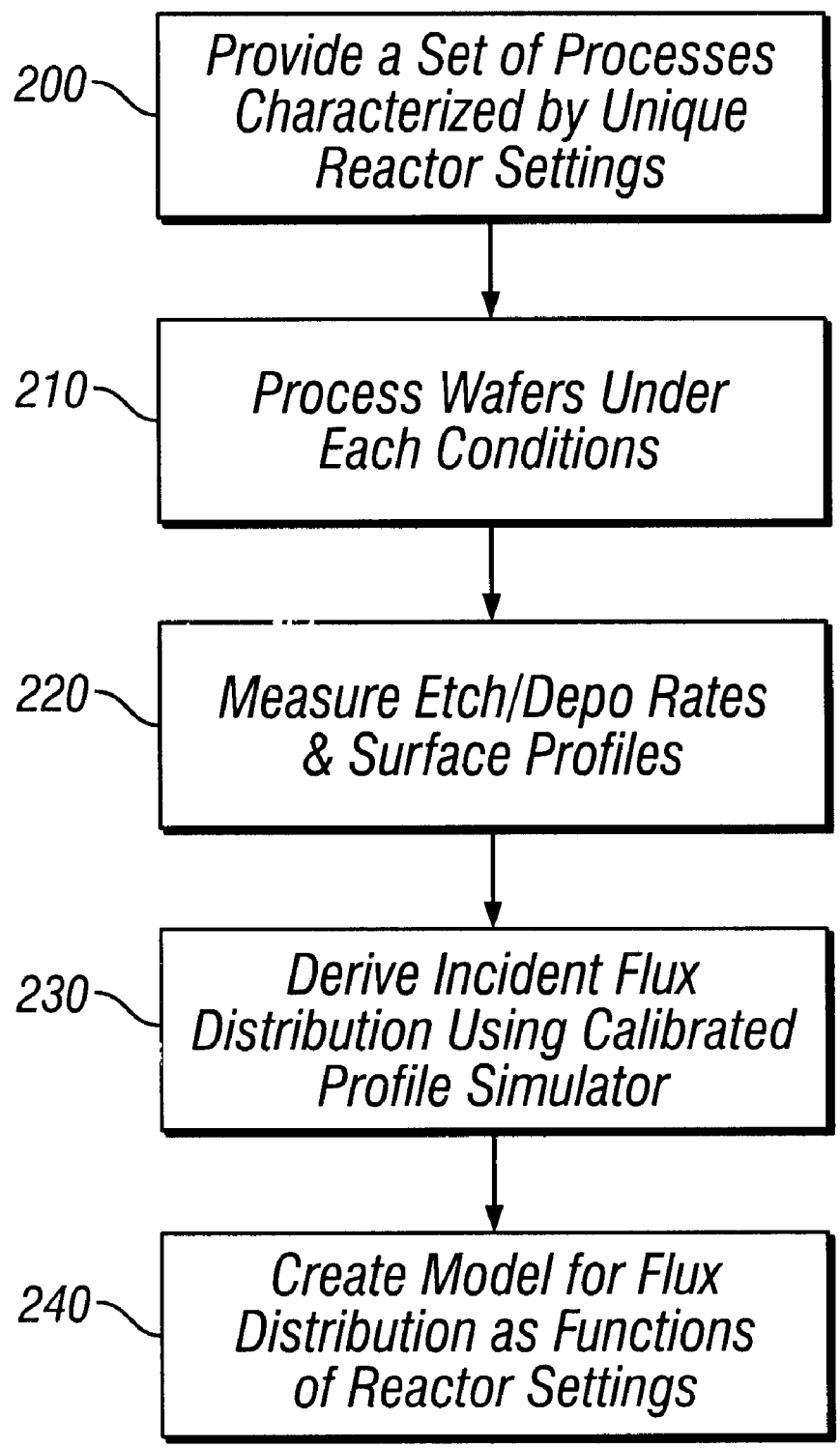
FIG. 2 is a flow chart illustrating a reactor model in accordance with a specific embodiment of the present invention.

The general procedure to use a semi-empirical profile simulator to create a reactor model which can predict neutral and ion flux distributions on a substrate as a function of a set of reactor settings is illustrated in FIG. 2. In a first block 200, a set of processes characterized by unique reactor settings is provided. These settings define a potential window of operation for a particular process and tool. The reactor settings may include TCP power, bias power, gas temperature, gas pressure, and gas flow within a plasma chamber 104 as shown in FIG. 1. Substrates 124, such as wafers, are then placed within plasma chamber 104 surrounded by plasma reactor 102. In block 210, the wafers are processed under each condition as provided in block 200. The etch and/or deposition rates and feature profiles are measured in block 220 using analytical instruments such as an ellipsometer, an electron microscope, or a profilometer as well known to those skill in the art.

In block 230, a calibrated profile simulator, containing a semi-empirical description of the etch or deposition rates and surface profile measurement in terms of the incident ion and neutral flux distributions and initial wafer state, operates to approximately match the measured etch or deposition rates and the surface profile on the substrate by adjusting unknown incident flux quantities.

Figure 3:
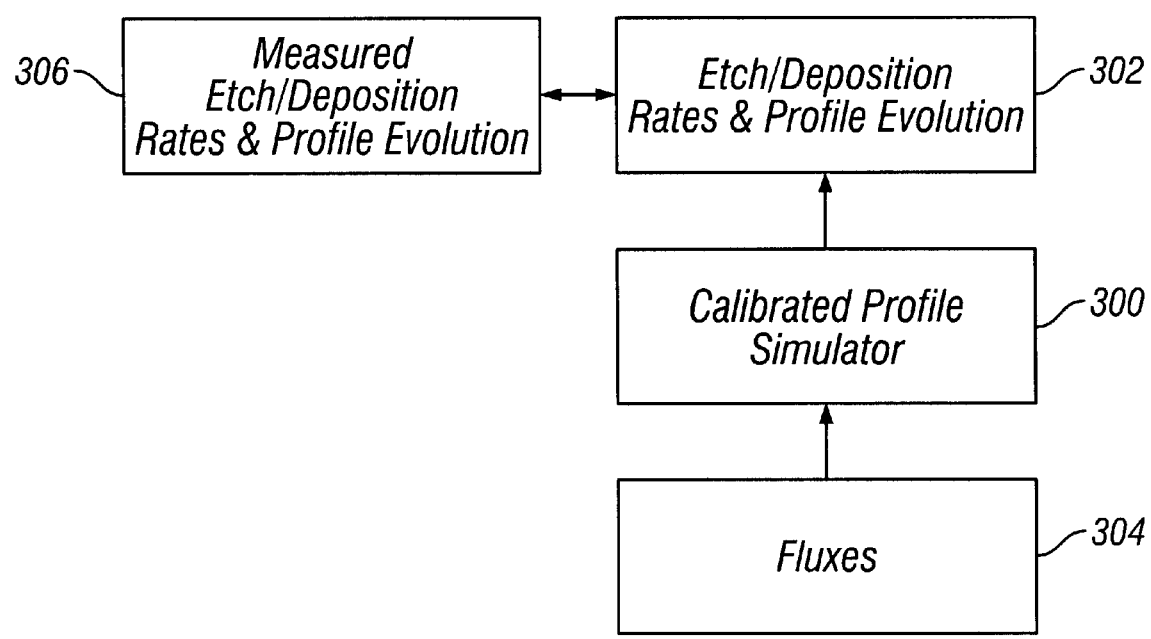
FIG. 3 is a flow chart illustrating a use of a calibrated profile simulator to derive flux distributions based on a measured etch/deposition rates & profile evolution.

FIG. 3 illustrates how the calibrated profile simulator is used to derive the incident ion and neutral flux distributions in terms of reactor settings. A calibrated profile simulator 300 generates etch and/or deposition rates and surface profiles evolution 302 in terms of a flux distribution 304. Measured etch/deposition rates and profiles evolution 306 are compared to the etch/deposition rates and profiles evolution 302 generated by profile simulator 300. Once both etch/deposition rates and profiles evolution from block 302 and block 306 match, the corresponding incident ion and neutral flux distributions 304 are provided through calibrated profile simulator 300. In other words, the calibrated profile simulator in block 300 uses the results of the data generated in block 306 to approximately predict neutral and ion flux distributions 304 on substrates.

Finally, in block 240 of FIG. 2, the flux distributions data are used to create a reactor model which predicts flux distributions on a substrate as linear or higher order functions of reactor settings. The model, for example, can be created by performing a least squares fit in which the difference between flux distributions predicted by the reactor model and the flux distributions calculated in block 230 is minimized. The combination of this reactor model with the calibrated profile simulator referenced in block 230 defines a process simulator capable of predicting etch and deposition rates and surface profiles as a function of processes defined by macroscopic reactor settings. The reactor model is used to predict incident flux distributions to wafers as a function of macroscopic reactor settings. These flux distributions are then input to the calibrated profile simulator along with an initial wafer state. Application of the profile simulator then leads to a prediction of etch and deposition rates and feature profiles.

A calibrated model for etch or deposition of a particular film stack with a particular chemistry such as hard masked polysilicon gate etching by a $Cl_2/O_2/HBr$ plasma can be used to create reactor models as previously described for any number of reactors, each of which may differ in design. These models can be used to accurately predict process settings such as reactor settings in different reactors that produce equivalent etch or deposition rates or surface profiles. For a given combination of process gases, and a particular type of wafer defined by its film stack and type of patterning, the evolution of feature profiles depends only on wafer temperature and the flux distribution of ions and reactive neutrals. With reactor models for multiple reactors, created by the process outlined in FIG. 2, a process for any given reactor can be equated to a process on a different reactor by choosing macroscopic reactor settings on that reactor which lead to the equivalent flux distributions to the wafer as predicted by the reactor model for each reactor.

By including test process data under conditions of varying exposed wafer area to calibrate the simulator, the simulator can be used to predict surface profile and etch or deposition rates and feature profiles as a function of the exposed area. The wafer exposed area may be treated as a macroscopic reactor setting. Process performance as a function of wafer exposed area may be predicted by developing a reactor model, using the method outlined in FIG. 2, in which the exposed area is chosen as one of the macroscopic reactor settings. The exposed area on a wafer may have a significant effect on the flux distributions arriving at the wafer because the exposed area of various films effects the type and rates of surface reactions. It is possible for the wafer surface to act as a significant source or sink of reactive neutral particles thus effecting the density of these species in the reactor chamber. Profile evolution on wafers having differing exposed area may then be modeled by using the flux distributions predicted by a reactor model for which exposed area is an input variable as inputs to the calibrated profile simulator.

Figure 4:
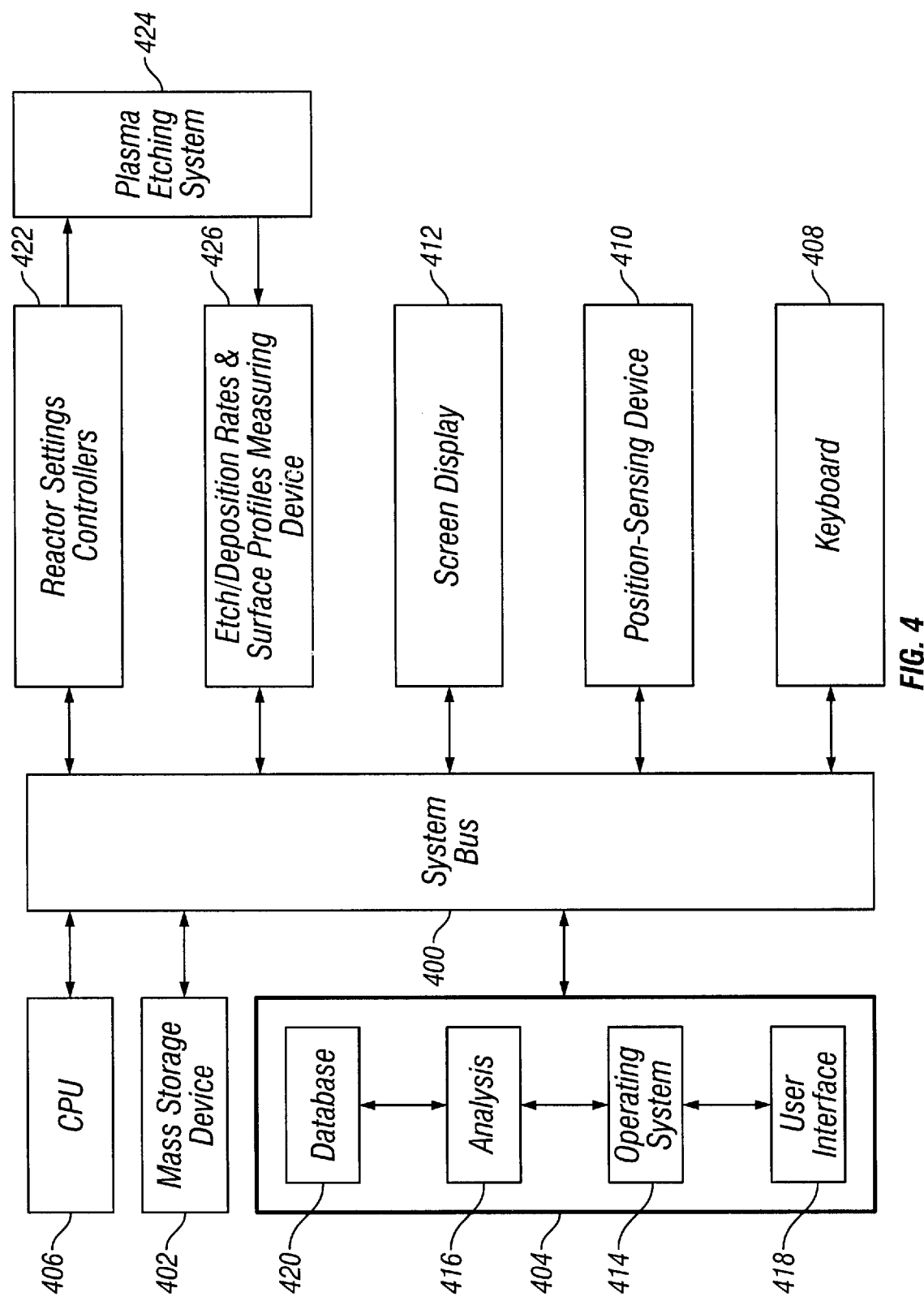
FIG. 4 is a block diagram showing a hardware in accordance with a specific embodiment of the present invention

Finally, FIG. 4 illustrates, in a block diagram form, a hardware system incorporating the invention. The system includes a system bus 400, over which all system components communicate, a mass storage device 402 (such as a hard disk or an optical storage unit) as well as a main system memory 404.

The operation of the illustrated system is directed by a central processing unit ("CPU") 406. The user interacts with the system using a keyboard 408 and a position-sensing device (such as a mouse) 410. The output of either device can be used to designate information or select particular areas of a screen display 412 to direct functions to be performed by the system.

The main memory 404 contains a group of modules that control the operation of CPU 406 and its interaction with the other hardware components. An operating system 414 directs the execution of low-level, basic system functions such as memory allocation, file management and operation of mass storage devices 402. At a higher level, an analysis module 416, implemented as a series of stored instructions, directs execution of the primary functions performed by the invention, as discussed below. Instructions defining a user interface 418 allow straightforward interaction over screen display 412. User interface 418 generates words or graphical images on display 412 to prompt action by the user, and accepts user commands from keyboard 408 and/or position-sensing device 410. The main memory 404 also includes one or more database 420, in general containing the reactor settings, the measured etch/deposition rates and surface profiles, etch/deposition rates and surface profiles and their corresponding flux distribution generated from a profile simulator.

It must be understood that although the modules of main memory 404 have been described separately, this is for clarity of presentation only; so long as the system performs all necessary functions, it is immaterial how they are distributed within the system and its programming architecture.

A CPU performs an algorithm based on the above method and sends its instructions to reactor settings controllers 422. The controllers defines the conditions under which substrates are subjected to processes in a plasma etching system 424. A measuring device 426, such as an electron microscope, measures the etch/deposition rates and surface profiles produced by the processes. The resulting data may be stored in the mass storage device 402 as well as in database 420.

In particular, the hardware system depicted in FIG. 4 may be used to implement the reactor model illustrated by FIG. 2 and FIG. 3. The provided set of processes characterized by unique reactor settings in block 200, the measured etch/deposition rates and surface profiles in block 220, the corresponding fluxes generated in block 304, the data generated by a calibrated profile simulator 300 are provided to the database 420 so that they are available to the analysis module 416. Alternatively, the module 416 may retrieve any of the reactor settings, corresponding fluxes, data generated by a calibrated profile simulator 300 from the mass storage device 402 or user interface 418 in response to a user command.

Turning now to FIG. 2, by providing a set of processes characterized by unique reactor settings in block 200 and deriving flux distributions in block 230 based the measured etch/deposition rates and surface profiles of substrates subjected to processes under each conditions in block 210, module 416 establishes a reactor model predicting flux distributions as functions of reactor settings. In block 306 (FIG. 3), module 416 accesses the etch/deposition rates and profile measuring device 426 and compares them with the data of etch/deposition rates and profile surfaces from a calibrated profile simulator 300 (FIG. 3). Once the data is matched to the measured etch/deposition rates and surface profiles, the corresponding neutral and ion fluxes 304 are produced and retained in the database 420.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method to predict a plurality of flux distributions on a substrate given a plurality of reactor settings, the method comprising:

providing a set of conditions characterized by a unique plurality of reactor settings;

processing a plurality of wafers using said set of conditions;

measuring a plurality of etch or deposition rates and at least one surface profile on said plurality of wafers;

deriving the plurality of flux distributions in terms of said plurality of etch or deposition rates and said at least one surface profile measurement using a calibrated profile simulator; and creating a reactor model.

2. The method of claim 1 further comprising placing the substrate within a plasma chamber surrounded by a plasma reactor.

3. The method of claim 1 further comprising subjecting the substrate to a plasma process.

4. The method of claim 1 wherein said plurality of flux distributions comprises a plurality of incident neutral and ion flux distributions.

5. The method of claim 1 wherein said plurality of reactor settings includes a plurality of elements selected from the group consisting of: transformer coupled plasma (TCP) power, bias power, gas pressure, gas flow, and gas temperature.

6. The method of claim 1 wherein the substrate has varying exposed area.

7. The method of claim 6 further comprising predicting the plurality of flux distribution as a function of said varying exposed area.

8. A method to determine a plurality of reactor settings for creating a desired plurality of flux distributions on a substrate, the method comprising:

providing a set of conditions characterized by a unique plurality of reactor settings;

processing a plurality of wafers using said set of conditions;

measuring a plurality of etch or deposition rates and at least one surface profile on said plurality of wafers;

deriving the plurality of flux distributions in terms of said plurality of etch or deposition rates and said at least one surface profile measurement using a calibrated profile simulator; and creating a reactor model.

9. The method of claim 8 further comprising placing the substrate within a plasma chamber surrounded by a plasma reactor.

10. The method of claim 8 further subjecting the substrate to a plasma process.

11. The method of claim 8 wherein said plurality of flux distributions comprises a plurality of incident neutral and ion flux distributions.

12. The method of claim 8 wherein said plurality of reactor settings includes a plurality of elements selected from the group consisting of: transformer coupled plasma (TCP) power, bias power, gas pressure, gas flow, and gas temperature.

13. The method of claim 8 wherein the substrate has varying exposed area.

14. The method of claim 13 further comprising predicting the plurality of flux distribution as a function of said varying exposed area.

15. An apparatus for predicting a plurality of flux distributions on a substrate given a plurality of reactor settings, the apparatus comprising:

computer processor means for processing data;

a computer memory for storing a plurality of flux distributions on the substrate;

a computer memory for storing a plurality of plasma reactor settings;

a computer memory for storing a plurality of etch or deposition rates;

means for providing a set of conditions characterized by a unique plurality of reactor settings;

means for processing a plurality of wafers using said set of conditions;

means for measuring a plurality of etch or deposition rates and at least one surface profile on said plurality of wafers; and means for deriving the plurality of flux distributions in terms of said plurality of etch or deposition rates and said at least one surface profile measurement using a calibrated profile simulator.

16. A program storage device readable by a machine, tangibly embodying a program of instructions readable by the machine to perform a method for predicting a plurality of flux distributions on a substrate given a plurality of reactor settings, the method comprising:

providing a set of conditions characterized by a unique plurality of reactor settings;

processing a plurality of wafers using said set of conditions;

measuring a plurality of etch or deposition rates and at least one surface profile on said plurality of wafers;

deriving the plurality of flux distributions in terms of said plurality of etch or deposition rates and said at least one surface profile measurement using a calibrated profile simulator; and creating a reactor model.

17. An apparatus for predicting a plurality of flux distributions on a substrate given a plurality of reactor settings, the apparatus comprising:

computer processor means for processing data;

a computer memory for storing a plurality of flux distributions on the substrate;

a computer memory for storing a plurality of plasma reactor settings;

a computer memory for storing a plurality of etch or deposition rates;

a plurality of controllers for providing a set of conditions characterized by a unique plurality of reactor settings;

a plasma etching system for processing a plurality of wafers using said set of conditions;

a measuring device for measuring a plurality of etch or deposition rates and at least one surface profile on said plurality of wafers; and an analysis module for deriving the plurality of flux distributions in terms of said plurality of etch or deposition rates and said at least one surface profile measurement using a calibrated profile simulator.

18. A program storage device readable by a machine, tangibly embodying a program of instructions readable by the machine to perform a method for determining a plurality of reactor settings for creating a desired plurality of flux distributions on a substrate, the method comprising:

providing a set of conditions characterized by a unique plurality of reactor settings;

processing a plurality of wafers using said set of conditions;

measuring a plurality of etch or deposition rates and at least one surface profile on said plurality of wafers;

deriving the plurality of flux distributions in terms of said plurality of etch or deposition rates and said at least one surface profile measurement using a calibrated profile simulator; and creating a reactor model.

* * * * *